(12) United States Patent
Bhattacharjee

(10) Patent No.: US 9,991,872 B2
(45) Date of Patent: Jun. 5, 2018

(54) MEMS RESONATOR WITH FUNCTIONAL LAYERS

(71) Applicant: RF Micro Devices, Inc., Greensboro, NC (US)

(72) Inventor: Kushal Bhattacharjee, Kernersville, NC (US)

(73) Assignee: Qorvo US, Inc., Greensboro, NC (US)

( * ) Notice: Subject to any disclaimer, the term of this patent is extended or adjusted under 35 U.S.C. 154(b) by 547 days.

(21) Appl. No.: 14/679,379

(22) Filed: Apr. 6, 2015

(65) Prior Publication Data

US 2015/0288345 A1 Oct. 8, 2015

Related U.S. Application Data

(60) Provisional application No. 61/975,331, filed on Apr. 4, 2014.

(51) Int. Cl.
*H01L 41/04* (2006.01)
*H03H 9/17* (2006.01)
*H03H 9/15* (2006.01)

(52) U.S. Cl.
CPC ......... *H03H 9/17* (2013.01); *H03H 2009/155* (2013.01)

(58) Field of Classification Search
CPC .... H03H 9/17; H03H 9/19; H03H 2009/2421; H03H 2009/155
See application file for complete search history.

(56) References Cited

U.S. PATENT DOCUMENTS

| 4,350,916 A | 9/1982 | August et al. |
| 4,798,989 A | 1/1989 | Miyazaki et al. |
| 5,504,772 A * | 4/1996 | Deacon ............... H01S 3/063 372/102 |
| 5,565,725 A | 10/1996 | Nakahata et al. |

(Continued)

FOREIGN PATENT DOCUMENTS

| CN | 105823904 A | 8/2016 |
| JP | S5778206 A | 5/1982 |

(Continued)

OTHER PUBLICATIONS

Quayle Action for U.S. Appl. No. 14/071,025, dated Mar. 8, 2016, 6 pages.

(Continued)

*Primary Examiner* — J. San Martin
(74) *Attorney, Agent, or Firm* — Withrow & Terranova, P.L.L.C.

(57) ABSTRACT

A MEMS device includes a substrate, at least one anchor on a surface of the substrate, and a vibrating body suspended over the substrate by the at least one anchor. The vibrating body includes a periodically poled piezoelectric thin-film layer, a first conductive layer, a second conductive layer, and a functional layer. The first conductive layer is on a first surface of the vibrating body opposite the surface of the substrate. The second conductive layer is on a second surface of the vibrating body opposite the first surface. The functional layer is over the first conductive layer. By including the functional layer over the first conductive layer, functionality may be added to the MEMS device, thereby increasing the utility thereof.

24 Claims, 14 Drawing Sheets

(56) References Cited

U.S. PATENT DOCUMENTS

| | | | |
|---|---|---|---|
| 5,739,624 A | 4/1998 | Kleiman | |
| 6,249,073 B1 | 6/2001 | Nguyen et al. | |
| 6,336,366 B1 | 1/2002 | Thundat et al. | |
| 6,349,454 B1 | 2/2002 | Manfra et al. | |
| 6,437,486 B1 | 8/2002 | Burcsu et al. | |
| 6,767,749 B2 | 7/2004 | Kub et al. | |
| 6,819,812 B2* | 11/2004 | Kochergin | G02B 26/001 372/20 |
| 6,909,221 B2 | 6/2005 | Ayazi et al. | |
| 7,250,705 B2 | 7/2007 | Dewa et al. | |
| 7,315,107 B2 | 1/2008 | Kando et al. | |
| 7,492,241 B2 | 2/2009 | Piazza et al. | |
| 7,586,239 B1 | 9/2009 | Li et al. | |
| 7,626,846 B2 | 12/2009 | Rao et al. | |
| 7,639,105 B2 | 12/2009 | Ayazi et al. | |
| 7,750,759 B1 | 7/2010 | Lee et al. | |
| 7,791,432 B2* | 9/2010 | Piazza | H03H 3/02 333/186 |
| 7,898,158 B1* | 3/2011 | Li | H03H 9/02275 310/320 |
| 8,035,280 B2 | 10/2011 | Li et al. | |
| 8,330,325 B1* | 12/2012 | Burak | H03H 9/173 310/320 |
| 8,421,558 B2 | 4/2013 | Yamane | |
| 8,508,108 B2 | 8/2013 | Anand et al. | |
| 9,117,593 B2 | 8/2015 | Bhattacharjee | |
| 9,369,105 B1* | 6/2016 | Li | H03H 9/0542 |
| 9,651,376 B2* | 5/2017 | Zolfagharkhani | G01C 19/5712 |
| 2003/0006676 A1 | 1/2003 | Smith et al. | |
| 2003/0119220 A1 | 6/2003 | Mlcak et al. | |
| 2004/0125472 A1 | 7/2004 | Belt | |
| 2004/0192040 A1* | 9/2004 | Peng | C30B 33/00 438/689 |
| 2004/0202399 A1* | 10/2004 | Kochergin | G02B 26/001 385/12 |
| 2004/0213302 A1* | 10/2004 | Fermann | H01S 3/0057 372/6 |
| 2005/0035687 A1 | 2/2005 | Xu et al. | |
| 2005/0184627 A1 | 8/2005 | Sano et al. | |
| 2006/0082256 A1 | 4/2006 | Bibl et al. | |
| 2006/0131997 A1 | 6/2006 | Kim et al. | |
| 2007/0200458 A1 | 8/2007 | Yoshino et al. | |
| 2007/0209176 A1 | 9/2007 | Kawakubo et al. | |
| 2007/0228887 A1 | 10/2007 | Nishigaki et al. | |
| 2007/0284971 A1 | 12/2007 | Sano et al. | |
| 2009/0200894 A1 | 8/2009 | Kando et al. | |
| 2010/0194499 A1 | 8/2010 | Wang et al. | |
| 2010/0237709 A1 | 9/2010 | Hall et al. | |
| 2011/0043895 A1* | 2/2011 | Hikmet | G02F 1/3775 359/328 |
| 2011/0181150 A1 | 7/2011 | Mahameed et al. | |
| 2012/0200912 A1* | 8/2012 | Hodgson | H01S 3/0057 359/330 |
| 2012/0234093 A1* | 9/2012 | Black | H01L 41/08 73/504.08 |
| 2013/0250383 A1* | 9/2013 | Mater | G03H 1/02 359/32 |
| 2014/0125201 A1 | 5/2014 | Bhattacharjee | |
| 2014/0183669 A1 | 7/2014 | Xu et al. | |
| 2014/0210314 A1 | 7/2014 | Bhattacharjee et al. | |
| 2014/0210315 A1 | 7/2014 | Bhattacharjee et al. | |
| 2014/0292155 A1* | 10/2014 | Ballandras | H03H 3/04 310/348 |
| 2016/0317228 A1* | 11/2016 | Fermann | A61B 90/20 |

FOREIGN PATENT DOCUMENTS

| | | |
|---|---|---|
| JP | S5895690 A | 6/1983 |
| WO | 03042687 A1 | 5/2003 |

OTHER PUBLICATIONS

Notice of Allowance for U.S. Appl. No. 14/031,383, dated Mar. 14, 2016, 8 pages.

Notice of Allowance for U.S. Appl. No. 14/031,454, dated Mar. 4, 2016, 8 pages.

Aigner, R. et al., "Advancement of MEMS into RF-Filter Applications," IEDM: International Electron Devices Meeting, Dec. 8-11, 2002, pp. 897-900, San Francisco CA.

Aigner, Robert et al., "Bulk-Acoustic-Wave Filters: Performance Optimization and Volume Manufacturing," IEEE MTT-S Digest, 2003, pp. 2001-2004.

Author Unknown, "An American National Standard: IEEE Standard on Piezoelectricity," ANSI/IEEE Std 176-1987, Copyright: 1988, 74 pages, The Institute of Electrical and Electronics Engineers, Inc., New York, NY.

Author Unknown, "Soitec Innovative Process for Materials Treatments—Smart Cut(R)," Soitec, Retrieved: Apr. 20, 2010, 1 page, www.soitec.com.

Author Unknown, "Standards on Piezoelectric Crystals, 1949," Proceedings of the I.R.E., Dec. 1949, pp. 1378-1395.

Bannon, III, Frank D. et al., "High-Q HF Microelectromechanical Filters," IEEE Journal of Solid-State Circuits, vol. 35, No. 4, Apr. 2000, pp. 512-526.

Bassignot, F. et al., "A new acoustic resonator concept based on acoustic waveguides using silicon/periodically poled transducer/silicon structures for RF applications," 2011 Joint Conference of the IEEE International Frequency Control and the European Frequency and Time Forum (FCS), 6 pages.

Zhu, Yong-Yuan et al., "Ultrasonic Excitation and Propagation in an Acoustic Superlattice," Journal of Applied Physics, vol. 72, No. 3, Aug. 1, 1992, pp. 904-914.

Batchko, Robert G. et al., "Backswitch Poling in Lithium Niobate for High-Fidelity Domain Patterning and Efficient Blue Light Generation," Applied Physics Letters, vol. 75, No. 12, Sep. 20, 1999, pp. 1673-1675.

Brown, Paul T. et al., "Control of Domain Structures in Lithium Tantalate Using Interferometric Optical Patterning," Optics Communications, vol. 163, May 15, 1999, pp. 310-316.

Chandrahalim, Hengky et al., "Channel-Select Micromechanical Filters Using High-K Dielectrically Transduced MEMS Resonators," Proceedings of the 19th International IEEE Micro Electro Mechanical Systems Conference (MEMS 2006), Jan. 22-26, 2006, pp. 894-897, Istanbul, Turkey.

Chen, Yan-Feng et al., "High-Frequency Resonance in Acoustic Superlattice of Periodically Poled LiTaO3," Applied Physics Letters, vol. 70, No. 5, Feb. 3, 1997, pp. 592-594.

Courjon, E. et al., "Periodically Poled Transducers Built on Single Crystal Lithium Niobate Layers Bonded onto Silicon," IEEE Ultrasonics Symposium, 2007, pp. 268-271.

Courjon, E. et al., "Pure Longitudinal Plate Mode Excited by Poled Domains Transducers on LiNbO3," Proceedings, EFTF*IEEE-FCS'07, May 29-Jun. 1, 2007, pp. 1073-1076.

Feld, David et al., "A High Performance 3.0 mm×3.0 mm×1.1 mm FBAR Full Band Tx Filter for U.S. PCS Handsets," Proceedings of the 2002 IEEE Ultrasonics Symposium, pp. 913-918.

Hannon, John J. et al.., "Lithium Tantalate and Lithium Niobate Piezoelectric Resonators in the Medium Frequency Range With Low Ratios of Capacitance and Low Temperature Coefficients of Frequency," IEEE Transactions on Sonics and Ultrasonics, vol. SU-17, No. 4, Oct. 1970, pp. 239-246.

Ho, Gavin K. et al., "High-Order Composite Bulk Acoustic Resonators," Technical Digest, IEEE Int. Conf. on Micro Electra Mechanical Systems, Jan. 21-25, 2007, pp. 791-794.

Hsu, Wan-Thai et al., "Stiffness-Compensated Temperature-Insensitive Micromechanical Resonators," Technical Digest, IEEE International Conference on Micro Electro Mechanical Systems, 2002, pp. 731-734, Las Vegas, NV.

Iula, Antonio et al.., "A Model for the Theoretical Characterization of Thin Piezoceramic Rings," IEEE Transactions on Ultrasonics, Ferroelectrics, and Frequency Control, vol. 43, No. 3, May 1996, pp. 370-375.

(56) References Cited

OTHER PUBLICATIONS

Kadota, Michio et al., "High Frequency Lamb Wave Resonator using LiNbO3 Crystal Thin Plate and Application to Tunable Filter," 2010 IEEE International Ultrasonics Symposium Proceedings, 2010, pp. 962-965.

Kim, Bongsang et al., "Frequency Stability of Wafer-Scale Encapsulated MEMS Resonators," Proceedings of the 13th International Conference on Solid-State Sensors, Actuators and Microsystems, Jun. 5-9, 2005, Seoul, Korea, pp. 1965-1968.

Kondo, Jungo et al., "High-Speed and Low-Driving-Voltage Thin-Sheet X-Cut LiNbO3 Modulator with Laminated Low-Dielectric-Constant Adhesive," IEEE Photonics Technology Letters, vol. 17, No. 10, Oct. 2005, pp. 2077-2079.

Kovacs, G. et al., "Improved Material Constants for LiNbO3 and LiTaO3," 1990 Ultrasonics Symposium, Copyright: 1990, pp. 435-438.

Kumar, A. K. Sarin et al., "High-Frequency Surface Acoustic Wave Device Based on Thin-Film Piezoelectric Interdigital Transducers," Applied Physics Letters, vol. 85, No. 10, Sep. 6, 2004, pp. 1757-1759.

Li, Sheng-Shian et al., "Micromechanical 'Hollow-Disk' Ring Resonators," Technical Digest, IEEE International Conference on Micro Electro Mechanical Systems, 2004, pp. 821-824, Maastricht, The Netherlands.

Li, Sheng-Shian et al., "Self-Switching Vibrating Micromechanical Filter Bank," Proceedings of the Joint IEEE Int. Frequency Control/Precision Time & Time Interval Symposium, Aug. 29-31, 2005, pp. 135-141, Vancouver, Canada.

Liu, Xiaoyan et al., "Nanoscale Chemical Etching of Near-Stoichiometric Lithium Tantalate," Journal of Applied Physics, vol. 97, 2005, pp. 064308-1 to 064308-4.

Majjad, H. et al., "Low Temperature Bonding of Interface Acoustic Waves Resonators on Silicon Wafers," Proceedings of the 2005 IEEE Ultrasonics Symposium, 2005, pp. 1307-1310.

Myers, L. E. et al., "Quasi-Phase-Matched Optical Parametric Oscillators in Bulk Periodically Poled LiNbO3," J. Opt. Soc. Am. B, vol. 12, No. 11, Nov. 1995, pp. 2102-2116.

Nakamura, Kiyoshi et al., "Local Domain Inversion in Ferroelectric Crystals and Its Application to Piezoelectric Devices," 1989 Ultrasonics Symposium, Copyright: 1989, pp. 309-318.

Onoe, Morio et al., "Zero Temperature Coefficient of Resonant Frequency in an X-Cut Lithium Tantalate at Room Temperature," Proceedings of the IEEE: Proceedings Letters, Aug. 1969, pp. 1446-1448.

Ostrovskii, I. V. et al., "Free Vibration of Periodically Poled Ferroelectric Plate," Journal of Applied Physics, vol. 99, No. 114106, 2006, pp. 114106-1 to 114106-6.

Osugi, Yukihisa et al., "Single Crystal FBAR with LiNbO3 and LiTaO3 Piezoelectric Substance Layers," Proceedings of the International Microwave Symposium Jun. 3-8, 2007, pp. 873-876, Honolulu, Hawaii.

Pastureaud, Thomas et al., "High-Frequency Surface Acoustic Waves Excited on Thin-Oriented LiNbO3 Single-Crystal Layers Transferred Onto Silicon," IEEE Transactions on Ultrasonics, Ferroelectrics, and Frequency Control, vol. 54, No. 4, Apr. 2007, pp. 870-876.

Piazza, G. et al., "Low Motional Resistance Ring-Shaped Contour-Mode Aluminum Nitride Piezoelectric Micromechanical Resonators for UHF Applications," Proceedings of the 18th International IEEE Micro Electro Mechanical Systems Conference, Jan. 30-Feb. 3, 2005, pp. 20-23, Miami, Florida.

Ruby, R. et al., "PCS 1900 MHz Duplexer Using Thin Film Bulk Acoustic Resonators (FBARs)," Electronics Letters, vol. 35, No. 10, May 13, 1999, pp. 794-795.

Ruby, Richard C. et al., "Thin Film Bulk Wave Acoustic Resonators (FBAR) for Wireless Applications," 2001 IEEE Ultrasonics Symposium, 2001, pp. 813-821.

Ruby, Richard et al., "Ultra-Miniature High-Q Filters and Duplexers Using FBAR Technology," 2001 IEEE International Solid-State Circuits Conference, Feb. 6, 2001, 3 pages.

Sliker, T. R. et al., "Frequency-Temperature Behavior of X-Cut Lithium Tantalate Resonators," Proceedings of the IEEE, Aug. 1968, p. 1402.

Smith, R. T. et al., "Temperature Dependence of the Elastic, Piezoelectric, and Dielectric Constants of Lithium Tantalate and Lithium Niobate," Journal of Applied Physics, vol. 42, No. 6, May 1971, pp. 2219-2230.

Stephanou, P. J. et al., "GHz Contour Extensional Mode Aluminum Nitride MEMS Resonators," Proceedings, IEEE Ultrasonics Symposium, Oct. 3-6, 2006, pp. 2401-2404.

Stephanou, P.J. et al., "GHz Higher Order Contour Mode ALN Annular Resonators," IEEE 20th International Conference on Micro Electro Mechanical Systems, Jan. 21-25, 2007, Kobe, Japan, pp. 787-790.

Wang, Jing et al., "1.14-GHz Self-Aligned Vibrating Micromechanical Disk Resonator," Technical Digest of the 2003 Radio Frequency Integrated Circuits Symposium, Jun. 8-10, 2003, pp. 335-338, Philadelphia, Pennsylvania.

Wang, Jing et al., "1.156-GHz Self-Aligned Vibrating Micromechanical Disk Resonator," IEEE Transactions on Ultrasonics, Ferroelectrics, and Frequency Control, vol. 51, No. 12, Dec. 2004, pp. 1607-1628.

Warner, A. W. et al., "Low Temperature Coefficient of Frequency in a Lithium Tantalate Resonator," Proceedings of the IEEE, Mar. 1967, p. 450.

Weisstein, Eric W., "Euler Angles," MathWorld—A Wolfram Web Resource, Retrieved: Apr. 29, 2009, http://mathworld.wolfram.com/EulerAngles.html, 4 pages.

Wong, Ark-Chew et al., "Micromechanical Mixer-Filters ('Mixlers')," Journal of Microelectromechanical Systems, vol. 13, No. 1, Feb. 2004, pp. 100-112.

Yamada, M. et al., "First-Order Quasi-Phase Matched LiNbO3 Waveguide Periodically Poled by Applying an External Field for Efficient Blue Second-Harmonic Generation," Applied Physics Letters, vol. 62, No. 5 Feb. 1, 1993, pp. 435-436.

Zhu, Yong-Yuan et al., "Crossed Field Excitation of an Acoustic Superlattice," Journal of Physics D: Applied Physics, vol. 29, 1996, pp. 185-187.

Notice of Allowance for U.S. Appl. No. 12/134,483, dated Mar. 24, 2009, 6 pages.

Notice of Allowance for U.S. Appl. No. 12/263,883, dated Oct. 28, 2010, 6 pages.

Notice of Allowance for U.S. Appl. No. 13/037,584, dated Jun. 9, 2011, 7 pages.

Notice of Allowance for U.S. Appl. No. 14/071,173, dated Apr. 21, 2015, 8 pages.

Non-Final Office Action for U.S. Appl. No. 12/202,624, dated May 18, 2012, 8 pages.

Final Office Action for U.S. Appl. No. 12/202,624, dated Jul. 27, 2012, 8 pages.

Advisory Action for U.S. Appl. No. 12/202,624, dated Sep. 7, 2012, 3 pages.

Non-Final Office Action for U.S. Appl. No. 12/202,624, dated Mar. 5, 2014, 8 pages.

Non-Final Office Action for U.S. Appl. No. 12/202,624, dated Apr. 9, 2015, 7 pages.

Non-Final Office Action for U.S. Appl. No. 14/703,060, dated Sep. 28, 2017, 8 pages.

* cited by examiner

US 9,991,872 B2

MEMS RESONATOR WITH FUNCTIONAL LAYERS

RELATED APPLICATIONS

This application claims the benefit of U.S. provisional patent application Ser. No. 61/975,331, filed Apr. 4, 2014, the disclosure of which is incorporated herein by reference in its entirety.

FIELD OF THE DISCLOSURE

The present disclosure relates to micro-electrical-mechanical systems (MEMS) devices, and specifically to MEMS devices including functional layers.

BACKGROUND

Micro-electrical-mechanical systems (MEMS) devices come in a variety of different types and are utilized across a broad range of applications. One type of MEMS device that may be used in applications such as radio frequency (RF) circuitry is a MEMS vibrating device. A MEMS vibrating device generally includes a vibrating body supported by at least one anchor and including a piezoelectric thin-film layer in contact with one or more conductive layers. As an electrical signal is presented to one or more of the conductive layers, the piezoelectric properties of the thin-film layer cause the layer to mechanically deform. The mechanical deformation of the thin-film layer in turn causes changes in the electrical characteristics of the thin-film layer, which may be utilized by circuitry connected to the device to perform one or more functions.

FIG. 1 shows a three-dimensional view of a conventional MEMS vibrating device 10. The conventional MEMS vibrating device 10 includes a substrate 12, a number of anchors 14 formed on a top surface 16 of the substrate 12, and a vibrating body 18 suspended over the substrate 12 by one or more mechanical support members 20 attached to the anchors 14. The vibrating body 18 includes a piezoelectric thin-film layer 22, a first conductive layer 24 on a first surface of the piezoelectric thin-film layer 22 opposite the top surface 16 of the substrate 12 and a second conductive layer 26 on a second surface of the piezoelectric thin-film layer 22 opposite the first surface. The piezoelectric thin-film layer 22, the first conductive layer 24, and the second conductive layer 26 may each form part of the mechanical support members 20 and extend over the anchors 14 to provide support for the vibrating body 18. A portion of the piezoelectric thin-film layer 22 and the first conductive layer 24 may be etched away in order to provide a connection point to the second conductive layer 26 as shown in FIG. 1.

In operation, the conventional MEMS vibrating device 10 can be operated as a piezoelectric transducer or a piezoelectric and electrostatic transducer. When the conventional MEMS vibrating device 10 is operated as a piezoelectric transducer, an alternating current (AC) voltage provided to the first conductive layer 24, the second conductive layer 26, or both, causes mechanical deformations in the piezoelectric thin-film layer 22, which present an electrical impedance that is dependent on the mechanical deformations in the piezoelectric transducer between the first conductive layer 24 and the second conductive layer 26. When the conventional MEMS vibrating device 10 is operated as a piezoelectric and electrostatic transducer, an AC voltage provided to the first conductive layer 24, the second conductive layer 26, or both, causes mechanical deformations in the piezoelectric thin-film layer 22, which present an electrical impedance that is dependent on the mechanical deformations in the piezoelectric transducer between the first conductive layer 24 and the second conductive layer 26 as discussed above. Further, a direct current (DC) voltage provided to the first conductive layer 24, the second conductive layer 26, or both, causes changes in the charge of the piezoelectric thin-film layer 22, which, along with the mechanical deformations caused by the AC voltage discussed above, vary a capacitance and acoustic length between the first conductive layer 24 and the second conductive layer 26. In some cases, the DC voltage may be varied to fine tune the response of the conventional MEMS vibrating device 10 to the AC voltage. That is, the electrostatic characteristics of the conventional MEMS vibrating device 10 may be utilized to adjust or tune the piezoelectric characteristics of the conventional MEMS vibrating device 10 in some circumstances. Further, the DC voltage may be modulated with a low frequency signal that is effectively mixed with the AC voltage.

As discussed in U.S. Pat. No. 8,035,280 issued to RF Micro Devices of Greensboro, N.C., the content of which is hereby incorporated by reference in its entirety, the piezoelectric thin-film layer 22 may be periodically poled. Accordingly, FIG. 2 shows a cross-section of the vibrating body 18, which is perpendicular to a front surface 28 (shown in FIG. 1) of the vibrating body 18. As shown in FIG. 2, the piezoelectric thin-film layer 22 includes a number of adjacent domains 30. Each one of the domains 30 represents a region of the piezoelectric thin-film layer 22 in which the dipoles of the piezoelectric material are substantially oriented in the same direction. The orientation of the dipoles in each particular domain 30 may be established by a poling process, in which an electric field with a particular poling orientation is provided to the particular region, thereby aligning the dipoles therein. In FIG. 2, a first set of the domains 30 have a nominal domain orientation, while a second set of the domains 30' have an inverted domain orientation. In general, the inverted domain is translated about 180° from the nominal domain. The domains 30 are alternated such that each nominal domain 30 is adjacent to an inverted domain 30' and each inverted domain 30' is in turn adjacent to a nominal domain 30.

Each domain 30 is defined by a width $W_D$ and a thickness $T_D$. In general, the widths of the nominal domain 30 and the inverted domain 30' do not have to be equal and may be denoted separately by $W_D$ and $W_D'$. In a predominately lateral vibrational mode of the conventional MEMS vibrating device 10, the width $W_D$ (and/or length $L_D$, which is shown below in FIG. 3) of the domains 30 is modulated based on a signal provided to the first conductive layer 24, the second conductive layer 26, or both. In a predominately thickness vibrational mode of the conventional MEMS vibrating device 10, the thickness $T_D$ of the domains 30 is modulated based on a signal provided to the first conductive layer 24, the second conductive layer 26, or both. In some situations, the conventional MEMS vibrating device 10 may operate in a mixed lateral and thickness vibrational mode in which both the width $W_D$ and the thickness $T_D$ of the domains 30 are modulated based on a signal provided to the first conductive layer 24, the second conductive layer 26, or both. The particular type of vibrations experienced by the conventional MEMS vibrating device 10 may be dependent on the type of materials used for the piezoelectric thin-film layer 22 as well as certain properties, such as the crystalline orientation, thereof. In general, the nominal domains 30 will move in an opposite manner to the inverted domains 30'. For example, the nominal domains 30 may expand while the inverted domains 30' shrink, or vice versa.

Due to the orientation of the domains 30 in the periodically poled piezoelectric thin-film layer 22, the periodically poled piezoelectric thin-film layer 22 will generally experience a greater amount of mechanical deformation in response to an electrical signal than conventional piezoelectric thin-film layers having a uniform dipole orientation throughout. Accordingly, using a periodically poled piezoelectric thin-film layer 22 in the conventional MEMS vibrating device 10 allows for the use of a flat or solid first conductive layer 24 and second conductive layer 26 since a desired amount of mechanical deformation of the piezoelectric thin-film layer 22 can be achieved without specialized conductive layer configurations such as inter-digitally transduced (IDT) conductive layers. Using flat or solid conductive layers increases the power handling capability of the conventional MEMS vibrating device 10. Further, using a periodically poled piezoelectric thin-film layer 22 in the conventional MEMS vibrating device 10 may increase the frequency of operation of the conventional MEMS vibrating device 10 two-fold when compared to MEMS devices utilizing piezoelectric thin-film layers having a uniform dipole orientation throughout.

FIG. 3 shows a top view of the periodically poled piezoelectric thin-film layer 22 wherein the second conductive layer 26 has been removed in order to show the details thereof. As shown in FIG. 3, each one of the domains 30 extends between lateral surfaces 32 of the vibrating body 18 such that the domains 30 form a number of adjacent elongated rectangles. The vibrating body 18 may be defined by a length $L_{VB}$ width $W_{VB}$. A length $L_D$ of each one of the domains 30 may be approximately equal to the length $L_{VB}$ of the vibrating body. Further, each one of the domains 30 may be defined by a width $W_D$ and a thickness $T_D$, as discussed above.

FIG. 4 shows a top view of the periodically poled piezoelectric thin-film layer 22 wherein the domains 30 are substantially square in shape and oriented in a checker-board pattern. In such a case, the length $L_D$ of each one of the domains 30 is about equal to the width $W_D$ of the domains 30. Using the pattern shown in FIG. 4 for the domains 30 may further increase the amount of mechanical deformation of the piezoelectric thin-film layer 22 in response to an electrical signal applied thereto, which may be desirable in certain applications.

While using periodically poled piezoelectric thin-film layers in MEMS devices may lead to performance enhancements thereof, the particular functionality of these MEMS devices is still rather limited. For example, the conventional MEMS vibrating device 10 discussed above has only limited functionality as a piezoelectric transducer and/or an electrostatic transducer. Accordingly, there is a need for MEMS devices that are adaptable to a wide variety of applications including electrical signal processing, mechanical signal processing, optical signal processing, electro-magnetic signal processing, wireless signal processing, and the like.

SUMMARY

The present disclosure relates to micro-electrical-mechanical systems (MEMS) devices, and specifically to MEMS devices including functional layers. In one embodiment, a MEMS device includes a substrate, at least one anchor on a surface of the substrate, and a vibrating body suspended over the substrate by the at least one anchor. The vibrating body includes a periodically poled piezoelectric thin-film layer, a first conductive layer, a second conductive layer, and a functional layer. The first conductive layer is on a first surface of the vibrating body opposite the surface of the substrate. The second conductive layer is on a second surface of the vibrating body opposite the first surface. The functional layer is over the first conductive layer. By including the functional layer over the first conductive layer, functionality may be added to the MEMS device, thereby increasing the utility thereof.

In one embodiment, the functional layer is between about 0.001 times a width of a nominal domain plus a width of an inverted domain in the periodically poled piezoelectric thin-film layer and 10 times the width of the nominal domain plus the width of the inverted domain. Further, the functional layer may be one of a dielectric material, a semiconductor material, an optically transparent material, an optically active material, a ferroelectric material, a pyroelectric material, and a ferromagnetic material. Using a functional layer that is one of a dielectric material, a semiconductor material, an optically transparent material, an optically active material, a ferroelectric material, a pyroelectric material, a magnetostrictive material, and a ferromagnetic material allows functionality to be added to the MEMS device, thereby increasing the utility thereof.

In one embodiment, the functional layer comprises a piezoelectric material. Further, the MEMS device may include a third conductive layer over the functional layer, and in some embodiments an additional functional layer over the second conductive layer and a fourth conductive layer over the additional functional layer. In this embodiment, an electrical response between the first conductive layer and the second conductive layer may be tuned based upon a signal provided to the third conductive layer, the fourth conductive layer, or both, due to one or more mechanical changes in the vibrating body as a result thereof. By including the functional layer and the additional functional layer and operating them as described, one or more properties of the vibrating body may be adjusted or tuned, thereby increasing the utility of the MEMS device.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 5:
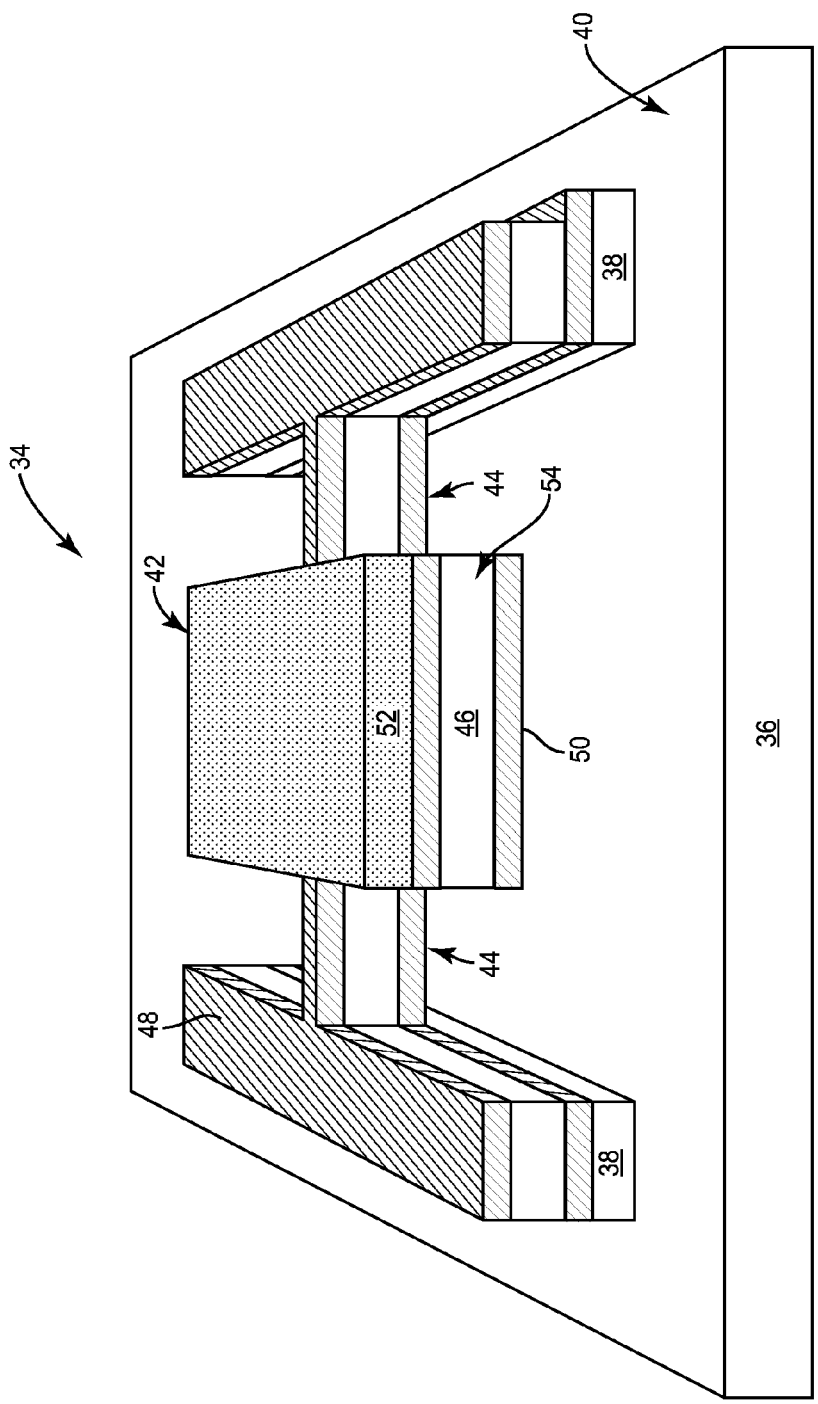
FIG. 5 is a three-dimensional representation of a MEMS vibrating device according to one embodiment of the present disclosure.

FIG. 5 shows a MEMS vibrating device 34 according to one embodiment of the present disclosure. The MEMS vibrating device includes a substrate 36, a number of anchors 38 formed on a top surface 40 of the substrate 36, and a vibrating body 42 suspended over the substrate 36 by one or more mechanical support members 44 attached to the anchors 38. The vibrating body 42 includes a piezoelectric thin-film layer 46, a first conductive layer 48 on a first surface of the piezoelectric thin-film layer 46 opposite the top surface 40 of the substrate 36, a second conductive layer 50 on a second surface of the piezoelectric thin-film layer 46 opposite the first surface, and a functional layer 52 on a surface of the first conductive layer 48 opposite the piezoelectric thin-film layer 46. A portion of the piezoelectric thin-film layer 46, the first conductive layer 48, and the second conductive layer 50 may each form part of the mechanical support members 44 and extend over the anchors 38 to provide support for the vibrating body 42. While not shown, the functional layer 52 may additionally form part of the mechanical support members 44 and extend over the anchors 38 to provide support for the vibrating body 42. In such an embodiment, portions of the functional layer 52 may be etched away in order to provide a connection point to the first conductive layer 48. A portion of the piezoelectric thin-film layer 46 and the first conductive layer 48 may be etched away in order to provide a connection point to the second conductive layer 50 as shown in FIG. 5.

Figure 3:
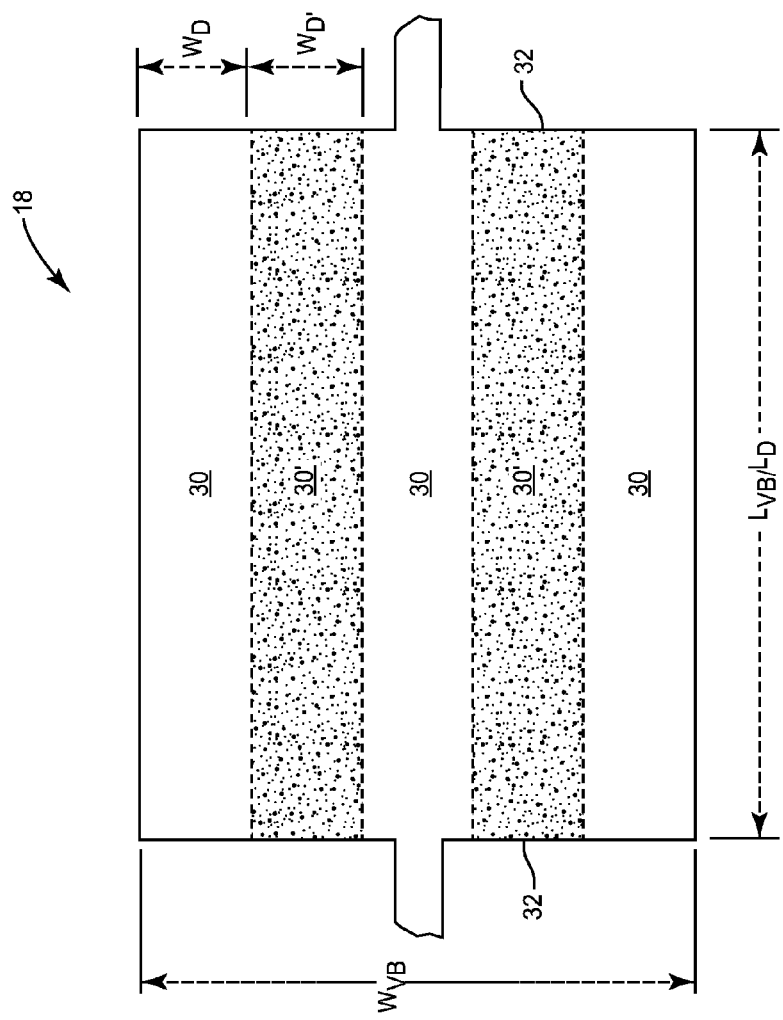
FIG. 3 is a cross-section showing additional details of the vibrating body in the conventional MEMS vibrating device shown in FIG. 1.
Figure 4:
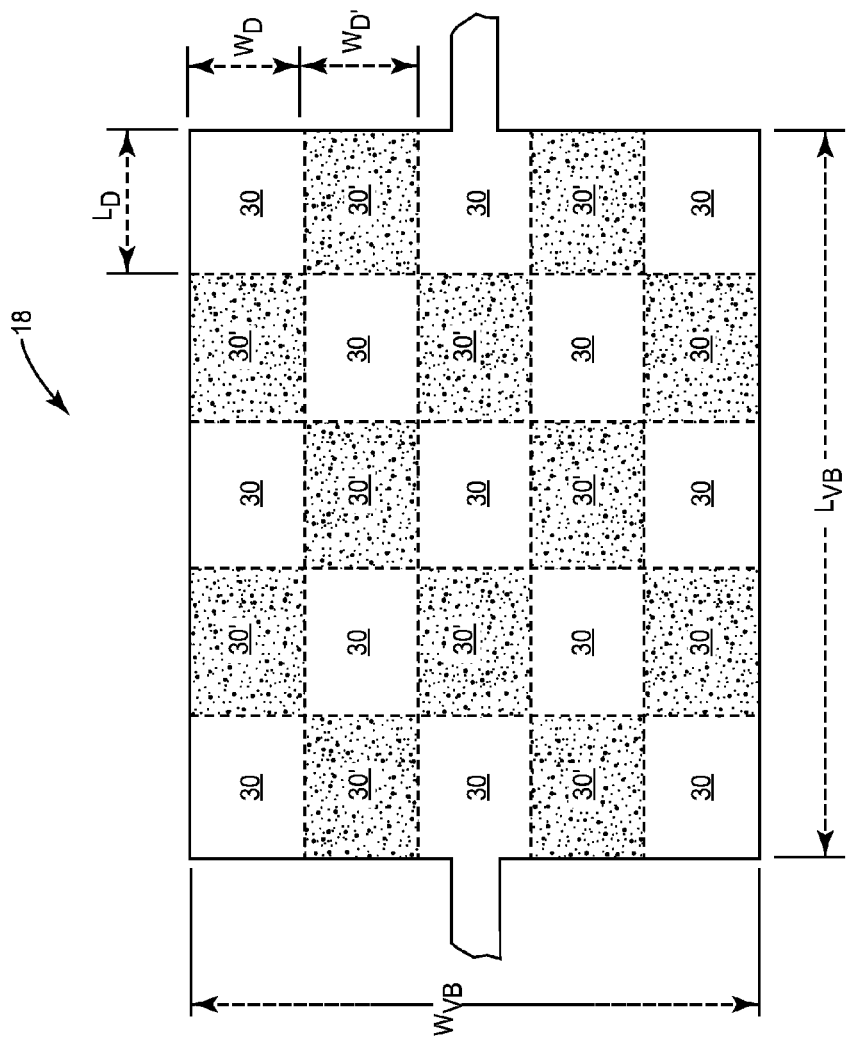
FIG. 4 is an additional cross-section showing additional details of the vibrating body in the conventional MEMS vibrating device shown in FIG. 1.

In operation, the MEMS vibrating device 34 may operate as described above. Further, due to the functional layer 52, the MEMS vibrating device 34 may perform additional functions as discussed below. The substrate 36 may be a semiconductor such as silicon, a piezoelectric material such as lithium niobate or lithium tantalate, or a purely dielectric material such as glass or fused silica. The anchors may be an insulating material such as silicon oxide. The piezoelectric thin-film layer 46 may be lithium niobate, lithium tantalate, or any other suitable piezoelectric material. As discussed above, the piezoelectric thin-film layer 46 may be periodically poled, as shown in either FIG. 3 or FIG. 4. The first conductive layer 48 and the second conductive layer 50 may be aluminum, tin, copper, or any other suitable conductive material. Those of ordinary skill in the art will appreciate that any suitable materials may be used for the substrate 36, the anchors 38, the piezoelectric thin-film layer 46, the first conductive layer 48, and the second conductive layer 50 without departing from the principles of the present disclosure.

The functional layer 52 may be a piezoelectric material, a semiconductor material, an optically transparent material, an optically active material, a ferroelectric material, a pyroelectric material, a ferromagnetic material, or some combination thereof. In general, the functional layer 52 is a material with one or more desired functional properties that may be modulated via mechanical deformation of the material. Providing the functional layer 52 on the vibrating body 42 may allow the MEMS vibrating device 34 to simultaneously perform multiple functions, or may enhance the performance of the MEMS vibrating device 34. For example, providing a functional layer 52 of semiconductor or dielectric material over the first conductive layer 48 may improve the heat dissipation characteristics of the MEMS vibrating device 34, thereby improving the overall performance thereof. As an additional example, providing a functional layer 52 of optically transparent or active material may allow the MEMS vibrating device 34 to modulate an optical signal, such as an incident beam of light or a beam of light traveling through the functional layer 52. As yet another example, providing a functional layer 52 of ferromagnetic material may allow the MEMS vibrating device 34 to modulate a magnetic field surrounding the device or vice versa.

Figure 1:
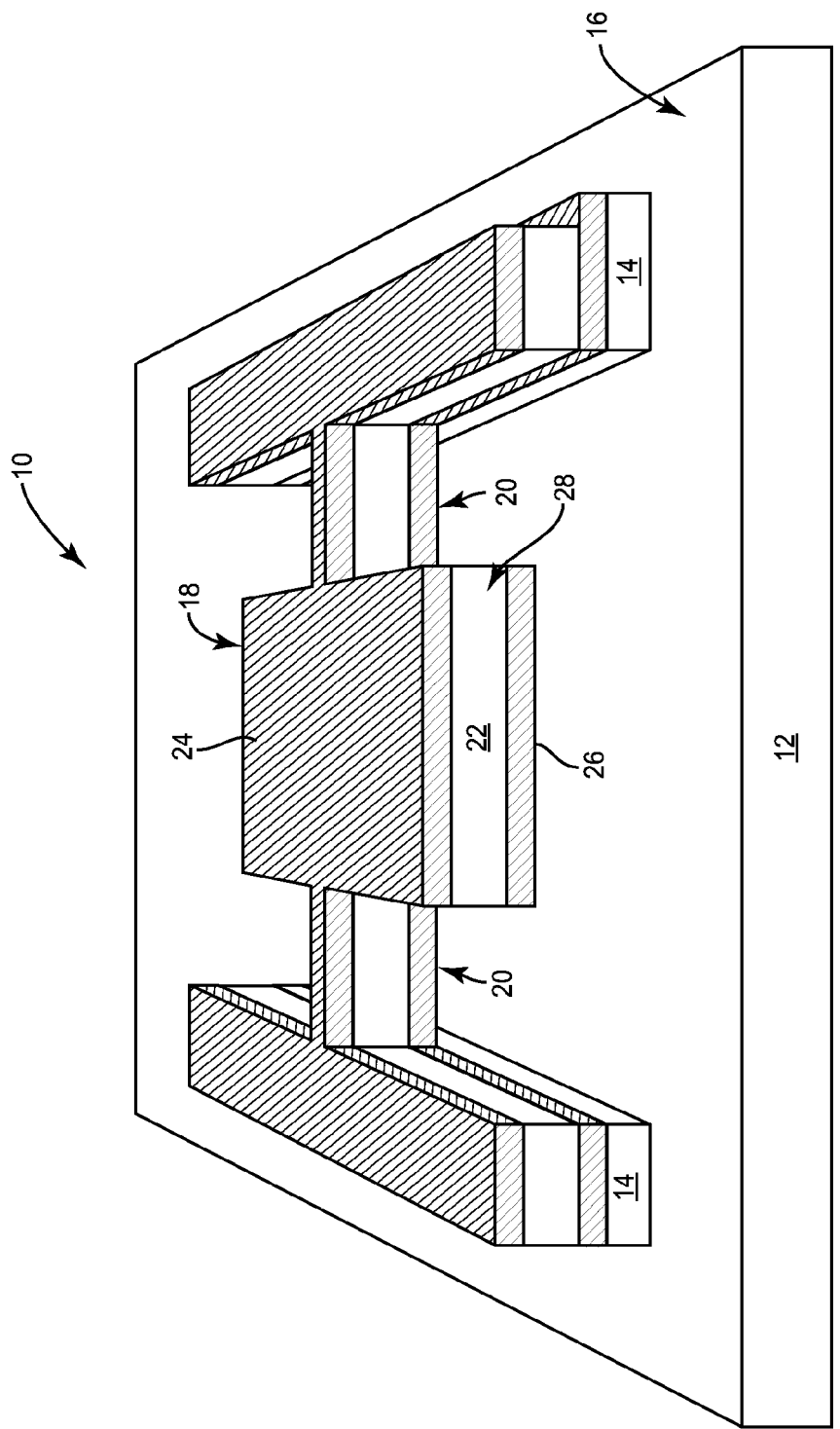
FIG. 1 is a three-dimensional representation of a conventional micro-electrical-mechanical systems (MEMS) device.
Figure 2:
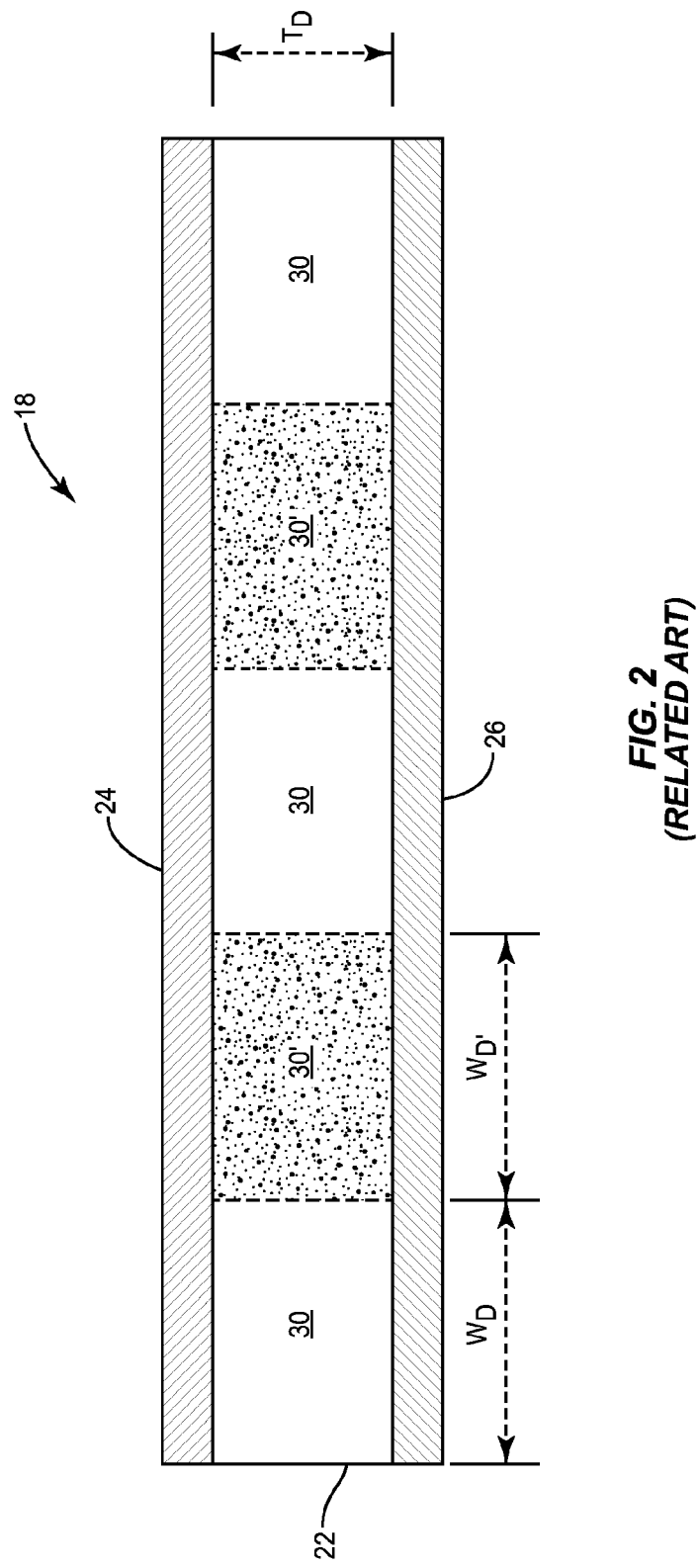
FIG. 2 is a cross-section showing details of a vibrating body in the conventional MEMS vibrating device shown in FIG. 1.
Figure 6:
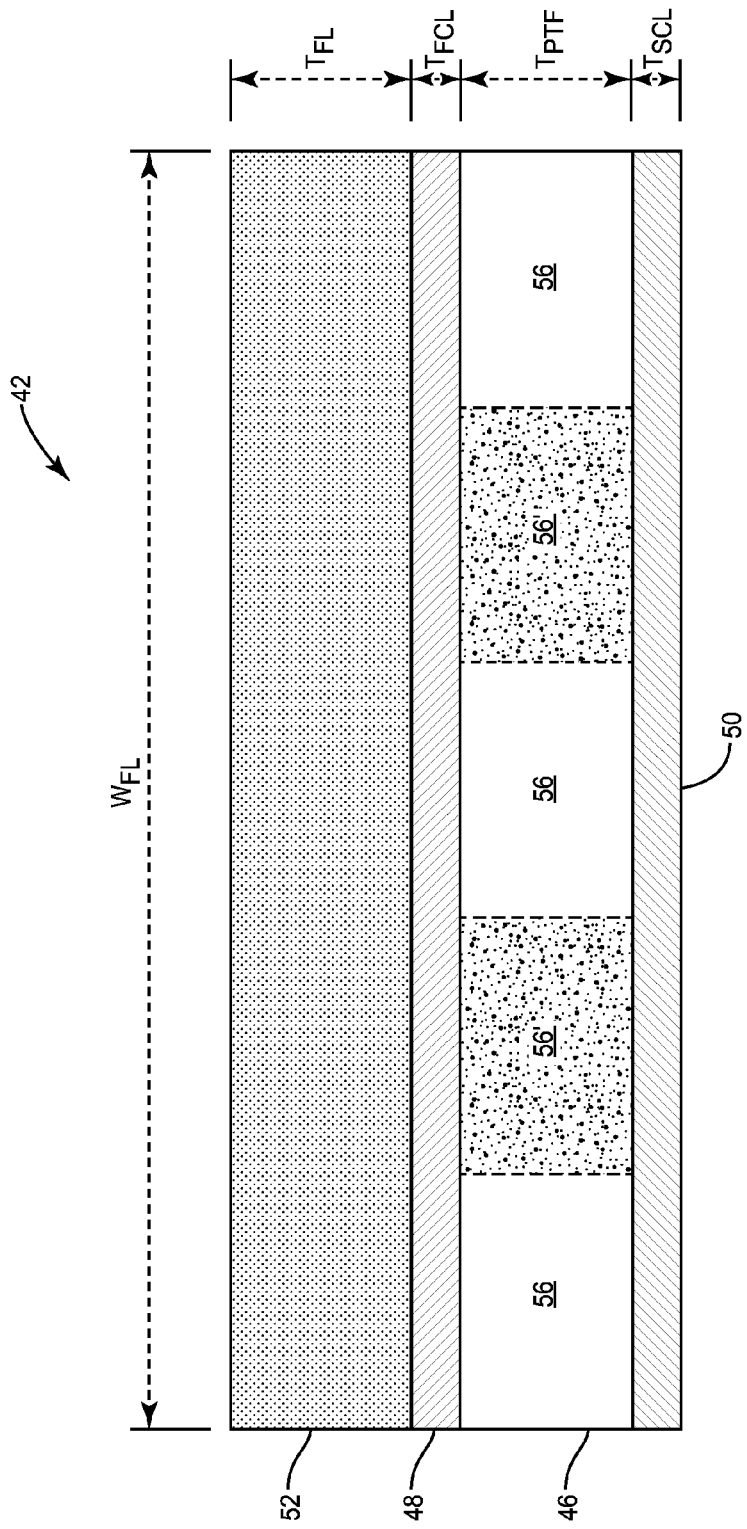
FIG. 6 is a cross-section showing details of a vibrating body in the MEMS vibrating device shown in FIG. 5 according to one embodiment of the present disclosure.

FIG. 6 shows a cross-section of the vibrating body 42, which is perpendicular to a front surface 54 (shown in FIG. 5) of the vibrating body 42, according to one embodiment of the present disclosure. The details of the vibrating body 42 are similar to those discussed above with respect to FIG. 2, however, the functional layer 52 is on the surface of the first conductive layer 48 opposite the piezoelectric thin-film layer 46. The piezoelectric thin-film layer 46 is shown including a number of periodically poled domains 56 as discussed above. The widths of regions 56 and 56' are denoted by $W_D$ and $W_D'$, respectively. The functional layer 52 is defined by a thickness $T_{FL}$ and a width $W_{FL}$, which is about equal to a width $W_{VB}$ of the vibrating body 42. The thickness $T_{FL}$ of the functional layer 52 may be between 0.001 times the width $W_D$ of the nominal domains 56 plus the width $W_D'$ of the inverted domains 56' and 10 times the width $W_D$ of the nominal domains 56 plus the width $W_D'$ of the inverted domains 56'. Further, a thickness $T_{PTF}$ of the piezoelectric thin-film layer 46 may be between 0.01 times the width $W_D$ of the nominal domains 56 plus the width $W_D'$ of the inverted domains 56' and 10 times the width $W_D$ of the nominal domains 56 plus the width $W_D'$ of the inverted domains 56', a thickness $T_{FCL}$ of the first conductive layer 48 may be between 0.001 times the width $W_D$ of the nominal domains 56 plus the width $W_D'$ of the inverted domains 56' and 1 times the width $W_D$ of the nominal domains 56 plus the width $W_D'$ of the inverted domains 56', and a thickness $T_{SCL}$ of the second conductive layer 50 may be between 0.001 times the width $W_D$ of the nominal domains 56 plus the width $W_D'$ of the inverted domains 56' and 1 times the width $W_D$ of the nominal domains 56 plus the width $W_D'$ of the inverted domains 56'. The width $W_D$ of the nominal domains 56 may be between about 0.01 um and 300 um. The width $W_D'$ of the inverted domains 56' may be between about 0.01 um and 300 um. As discussed above, as a signal is applied to the first conductive layer 48, the second conductive layer 50, or both, the piezoelectric thin-film layer 46 mechanically deforms. In addition to altering the electrical characteristics of the piezoelectric thin-film layer 46, these mechanical deformations may also modulate one or more properties of the functional layer 52, which may be utilized to implement additional functionality of the MEMS vibrating device 34 as discussed above. Although not shown, the functional layer 52 may also be provided on a second surface of the second conductive layer 50 opposite the piezoelectric thin-film layer 46 without departing from the principles of the present disclosure.

Figure 7:
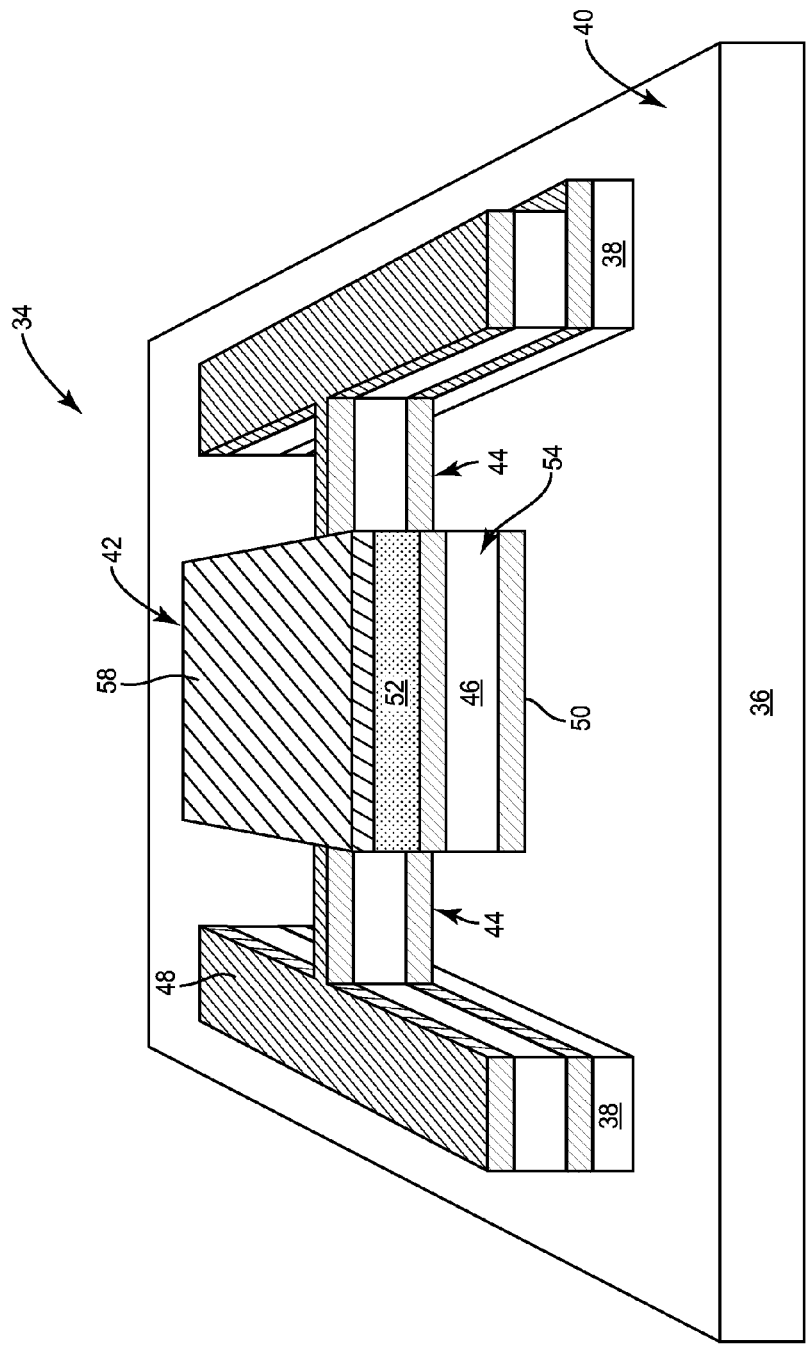
FIG. 7 is a three-dimensional representation of a MEMS vibrating device according to an additional embodiment of the present disclosure.

FIG. 7 shows the MEMS vibrating device 34 according to an additional embodiment of the present disclosure. The MEMS vibrating device 34 shown in FIG. 7 is substantially similar to that shown in FIG. 5, but further includes a third conductive layer 58 on a surface of the functional layer 52 opposite the first conductive layer 48. The third conductive layer 58 may form part of the mechanical support members 44 and extend over the anchors 38 to provide support for the vibrating body 42. As discussed above, portions of the functional layer 52 and the third conductive layer 58 may be etched away in such an embodiment in order to provide a connection point to the first conductive layer 48.

Providing the third conductive layer 58 allows an electrical signal to be provided to the functional layer 52, which may be used to implement additional functionality of the MEMS vibrating device 34. For example, the functional layer 52 may be a piezoelectric material, such that electrical signals delivered to the third conductive layer 58 result in mechanical deformation of the functional layer 52. Because mechanical deformation of the functional layer 52 will cause a similar mechanical deformation of the piezoelectric thin-film layer 46, which will in turn change the response of the piezoelectric thin-film layer 46 to signals provided to the first conductive layer 48, the second conductive layer 50, or both, signals provided to the third conductive layer 58 may thus be used to adjust or tune the MEMS vibrating device 34 in some embodiments. In other embodiments, signals provided to the third conductive layer 58 may be used to further modulate one or more other properties of the functional layer 52.

Figure 8:
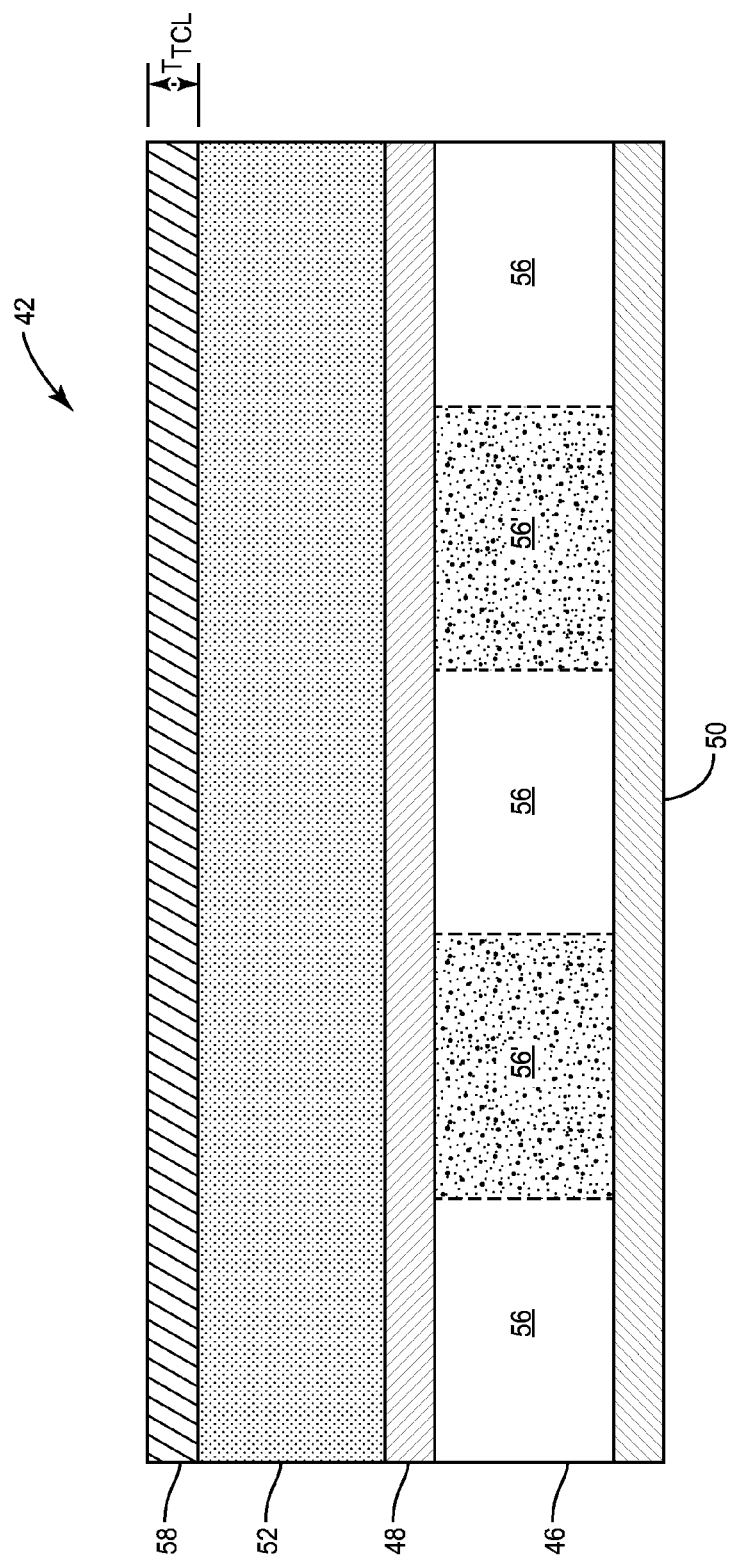
FIG. 8 is a cross-section showing details of a vibrating body in the MEMS vibrating device shown in FIG. 7 according to one embodiment of the present disclosure.

FIG. 8 shows a cross-section of the vibrating body 42, which is perpendicular to a front surface of the vibrating body 42, according to one embodiment of the present disclosure. The details of the vibrating body 42 are substantially similar to those discussed above with respect to FIG. 6; however, the third conductive layer 58 is shown on the surface of the functional layer 52 opposite the first conductive layer 48. A thickness $T_{TCL}$ of the third conductive layer 58 may be between 0.001 times the width $W_D$ of the nominal domains 56 plus the width $W_D'$ of the inverted domains 56' and 1 times the width $W_D$ of the nominal domains 56 plus the width $W_D'$ of the inverted domains 56'. In one embodiment wherein the functional layer 52 comprises a piezoelectric material, the domain of the functional layer 52 may be parallel, anti-parallel, oblique, or inverted with respect to any one of the domains 56 in the piezoelectric thin-film layer 46. Although not shown, the functional layer 52 and the third conductive layer 58 may also be provided on a surface of the second conductive layer 50 opposite the piezoelectric thin-film layer 46 without departing from the principles of the present disclosure.

Figure 9:
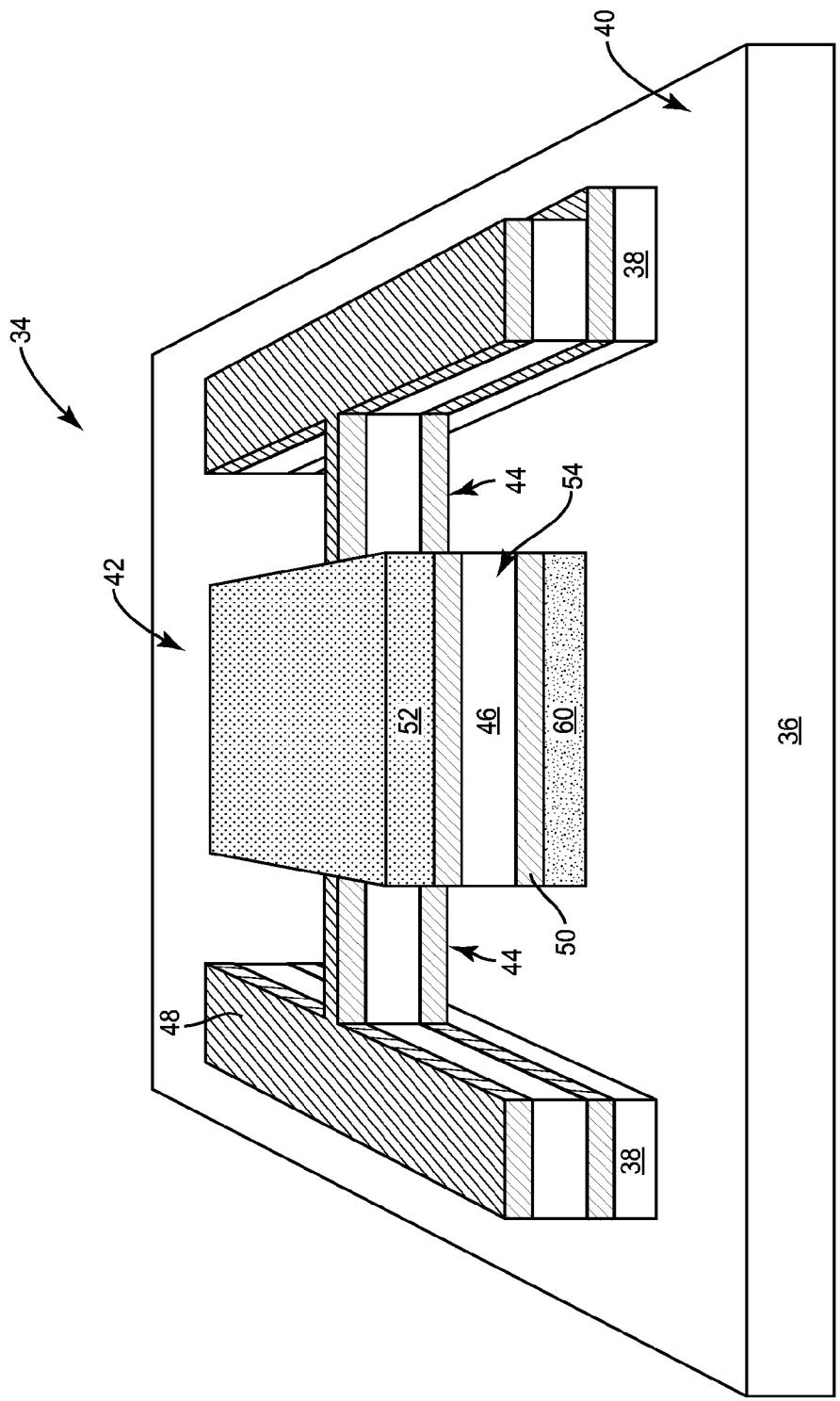
FIG. 9 is a three-dimensional representation of a MEMS vibrating device according to an additional embodiment of the present disclosure.

FIG. 9 shows the MEMS vibrating device 34 according to an additional embodiment of the present disclosure. The MEMS vibrating device 34 shown in FIG. 9 is substantially similar to that shown in FIG. 5, but further includes an additional functional layer 60 on a surface of the second conductive layer 50 opposite the piezoelectric thin-film layer 46. Although not shown, the additional functional layer 60 may form part of the mechanical support members 44 and extend over the anchors 38 to provide support for the vibrating body 42. Further, the anchors 38 may be extended in such an embodiment such that the additional functional layer 60 does not contact the substrate 36. Similar to the functional layer 52, the additional functional layer 60 may be a piezoelectric material, a semiconductor material, an optically transparent material, an optically active material a ferroelectric material, a pyroelectric material, a ferromagnetic material, a magnetostrictive material, or some combination thereof. In general, the additional functional layer 60 is a material with one or more desired functional properties that may be modulated via mechanical deformation of the material. The additional functional layer 60 may be the same or a different material from that of the functional layer 52.

Providing both the functional layer 52 and the additional functional layer 60 may increase the performance of the MEMS vibrating device 34 and/or add additional functionality to the device. For example, in the case wherein the functional layer 52 and the additional functional layer 60 are a semiconductor or dielectric material, the heat dissipation characteristics of the MEMS vibrating device 34 may be significantly improved, thereby improving the overall performance thereof. In other embodiments, the functional layer 52 and the additional functional layer 60 may each perform separate tasks that add to the functionality of the MEMS vibrating device 34.

Figure 10:
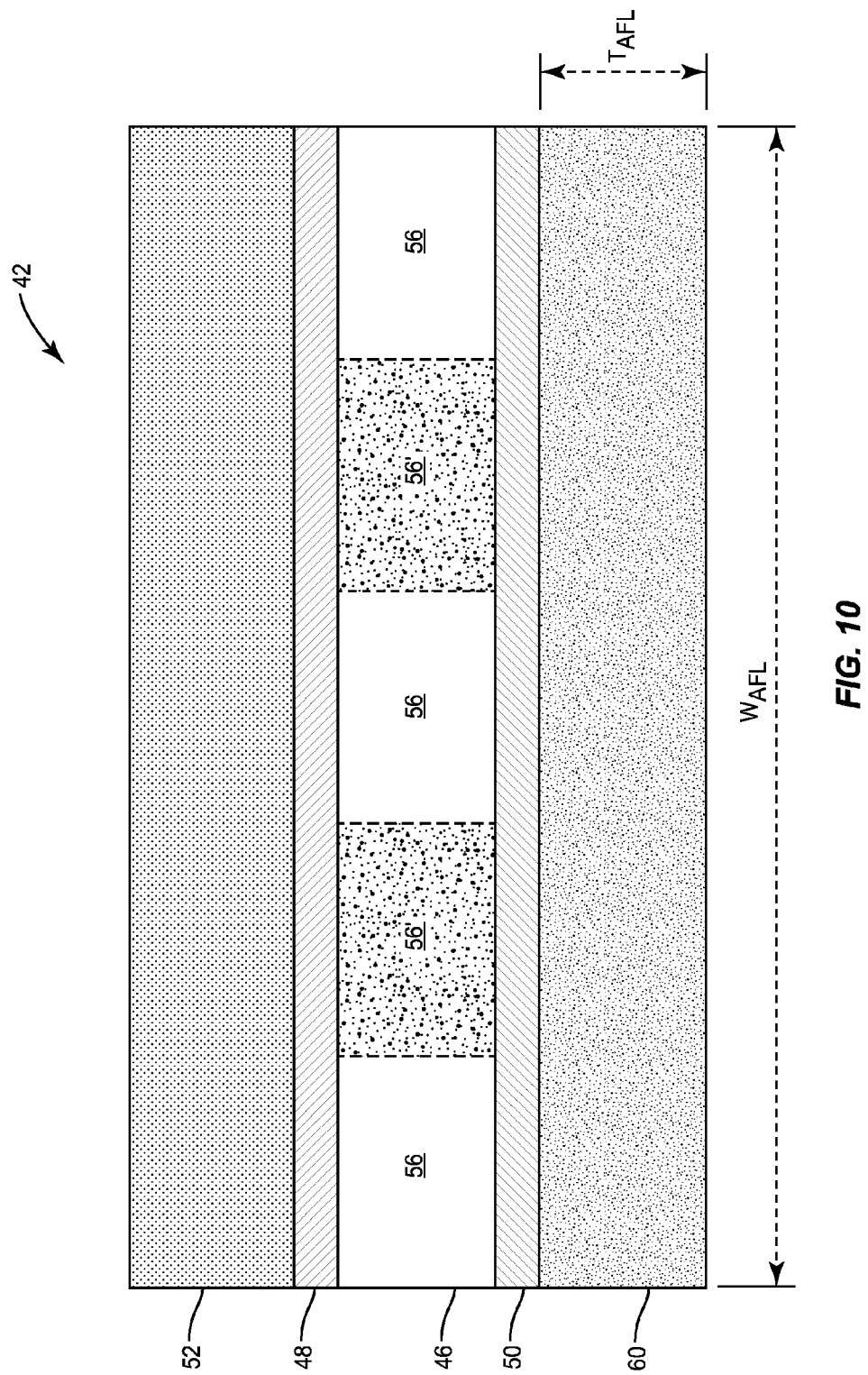
FIG. 10 is a cross-section showing details of a vibrating body in the MEMS vibrating device shown in FIG. 9 according to one embodiment of the present disclosure.

FIG. 10 shows a cross-section of the vibrating body 42, which is perpendicular to the front surface 54 of the vibrating body 42, according to one embodiment of the present disclosure. The details of the vibrating body 42 are similar to those discussed above with respect to FIG. 6; however, the additional functional layer 60 is on the surface of the second conductive layer 50 opposite the piezoelectric thin-film layer 46. The additional functional layer 60 may be defined by a thickness $T_{AFL}$ and a width $W_{AFL}$, which is about equal to the width $W_{VB}$ of the vibrating body 42. The widths of regions 56 and 56' are denoted by $W_D$ and $W_D'$, respectively. The thickness $T_{AFL}$ of the additional functional layer 60 may be between 0.001 times the width $W_D$ of the nominal domains 56 plus the width $W_D'$ of the inverted domains 56' and 10 times the width $W_D$ of the nominal domains 56 plus the width $W_D'$ of the inverted domains 56'.

Figure 11:
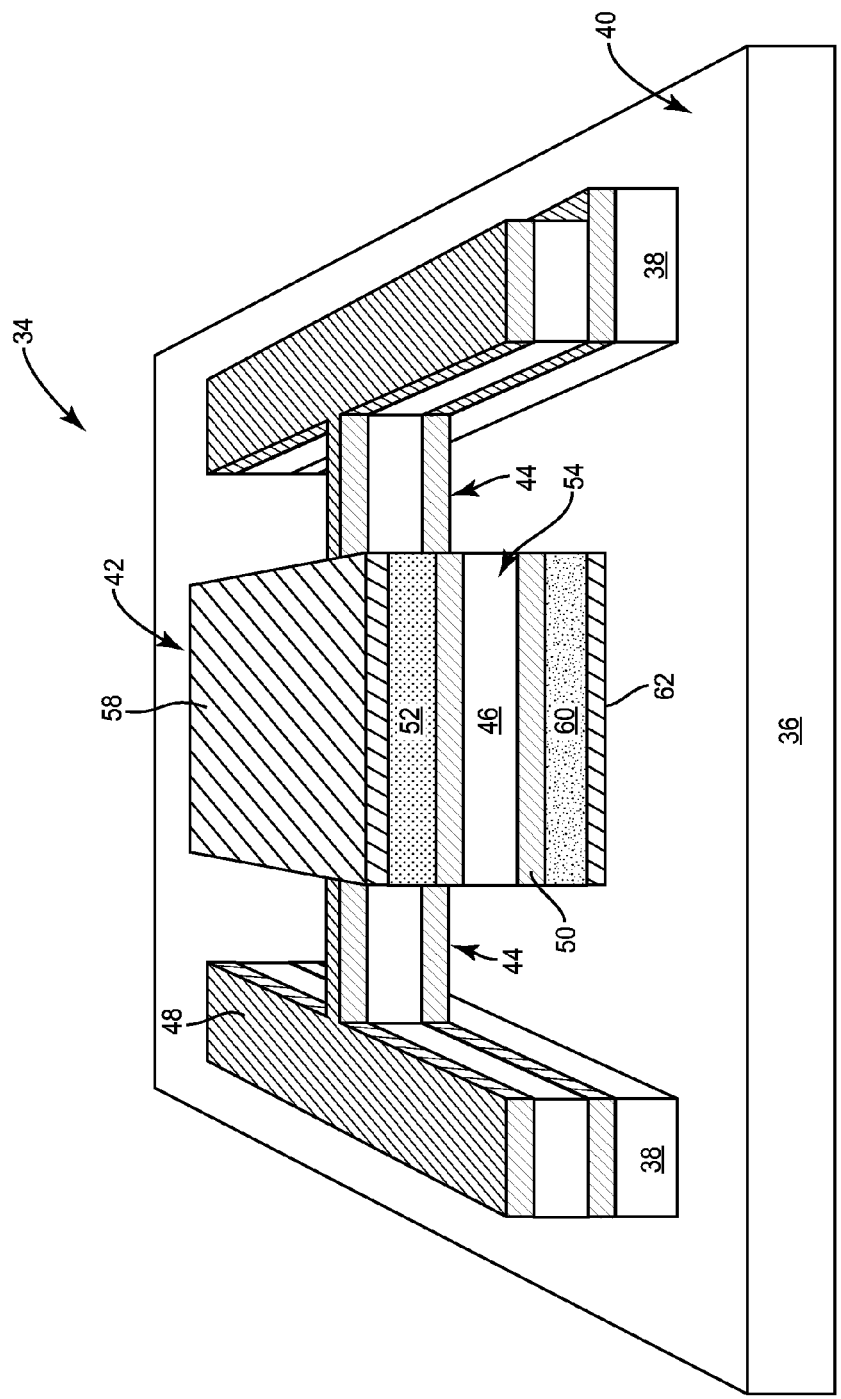
FIG. 11 is a three-dimensional representation of a MEMS vibrating device according to an additional embodiment of the present disclosure.

FIG. 11 shows the MEMS vibrating device 34 according to an additional embodiment of the present disclosure. The MEMS vibrating device 34 shown in FIG. 11 is substantially similar to that shown in FIG. 9, but further includes the third conductive layer 58 and a fourth conductive layer 62 on a surface of the additional functional layer 60 opposite the second conductive layer 50. The third conductive layer 58 may be provided as discussed above with respect to FIG. 7. While not shown, the fourth conductive layer 62 may form part of the mechanical support members 44 and extend over the anchors 38 to provide support for the vibrating body 42. As discussed above, portions of any of the layers discussed above may be strategically etched away in order to provide connection points to the various conductive layers as necessary.

Providing the functional layer 52, the additional functional layer 60, the third conductive layer 58, and the fourth conductive layer 62 may provide additional functionality of the MEMS vibrating device 34. For example, in one embodiment wherein the functional layer 52 and the additional functional layer 60 are piezoelectric materials, the third conductive layer 58 and the fourth conductive layer 62 may be utilized to provide electrical signals thereto. As signals are delivered to the third conductive layer 58, the fourth conductive layer 62, or both, the functional layer 52, the additional functional layer 60, or both, will mechanically deform. This results in a similar mechanical deformation of the piezoelectric thin-film layer 46, which may change the response of the piezoelectric thin-film layer 46 to signals provided to the first conductive layer 48, the second conductive layer 50, or both. Accordingly, signals provided to the third conductive layer 58, the fourth conductive layer 62, or both, may be used to adjust or tune the behavior of the MEMS vibrating device 34 in some embodiments. In other embodiments, signals provided to the third conductive layer 58, the fourth conductive layer 62, or both, may be used to further modulate one or more properties of the functional layer 52, the additional functional layer 60, or both.

Figure 12:
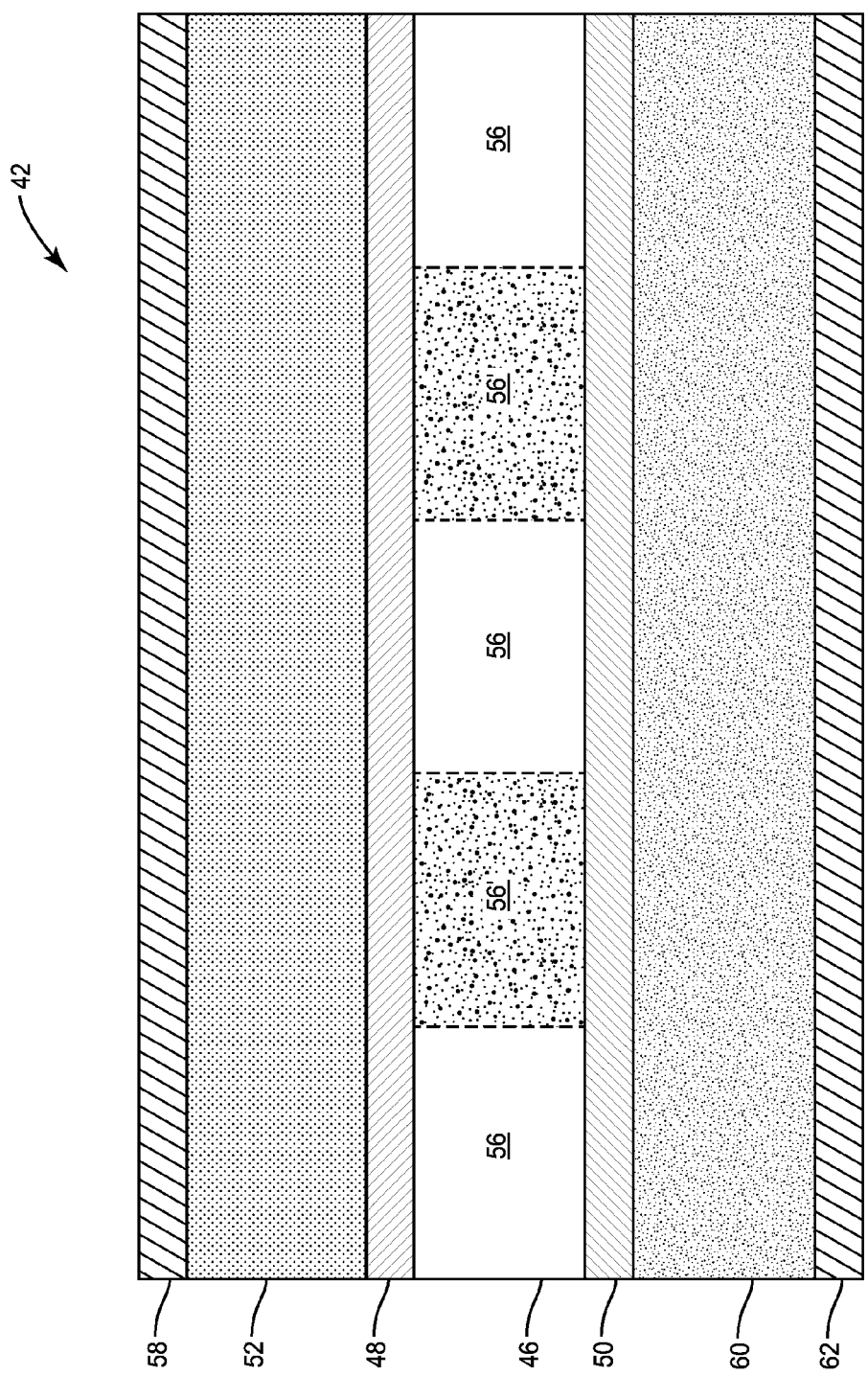
FIG. 12 is a cross-section showing details of a vibrating body in the MEMS vibrating device shown in FIG. 11 according to one embodiment of the present disclosure.

FIG. 12 shows a cross-section of the vibrating body 42, which is perpendicular to the front surface of the vibrating body 42, according to one embodiment of the present disclosure. The details of the vibrating body 42 are substantially similar to those discussed above with respect to FIG. 10, however, the third conductive layer 58 is shown on the surface of the functional layer 52 opposite the first conductive layer 48 and the fourth conductive layer 62 is shown on the surface of the additional functional layer 60 opposite the second conductive layer 50. In one embodiment wherein the functional layer 52 and the additional functional layer 60 comprise piezoelectric materials, the domain of the functional layer 52 may be inverted with respect to the domain of the additional functional layer 60. Accordingly, a DC voltage placed across the third conductive layer 58 and the fourth conductive layer 62 may cause the functional layer 52 and the additional functional layer 60 to act as a piezoelectric bimorph, which may result in a large amount of mechanical deformation of the MEMS vibrating body 42 in order to modulate one or more properties of the MEMS vibrating body 42. In an additional embodiment, the domains of the functional layer 52 and the additional functional layer 60 may be parallel, anti-parallel, or oblique with respect to one another.

Figure 13:
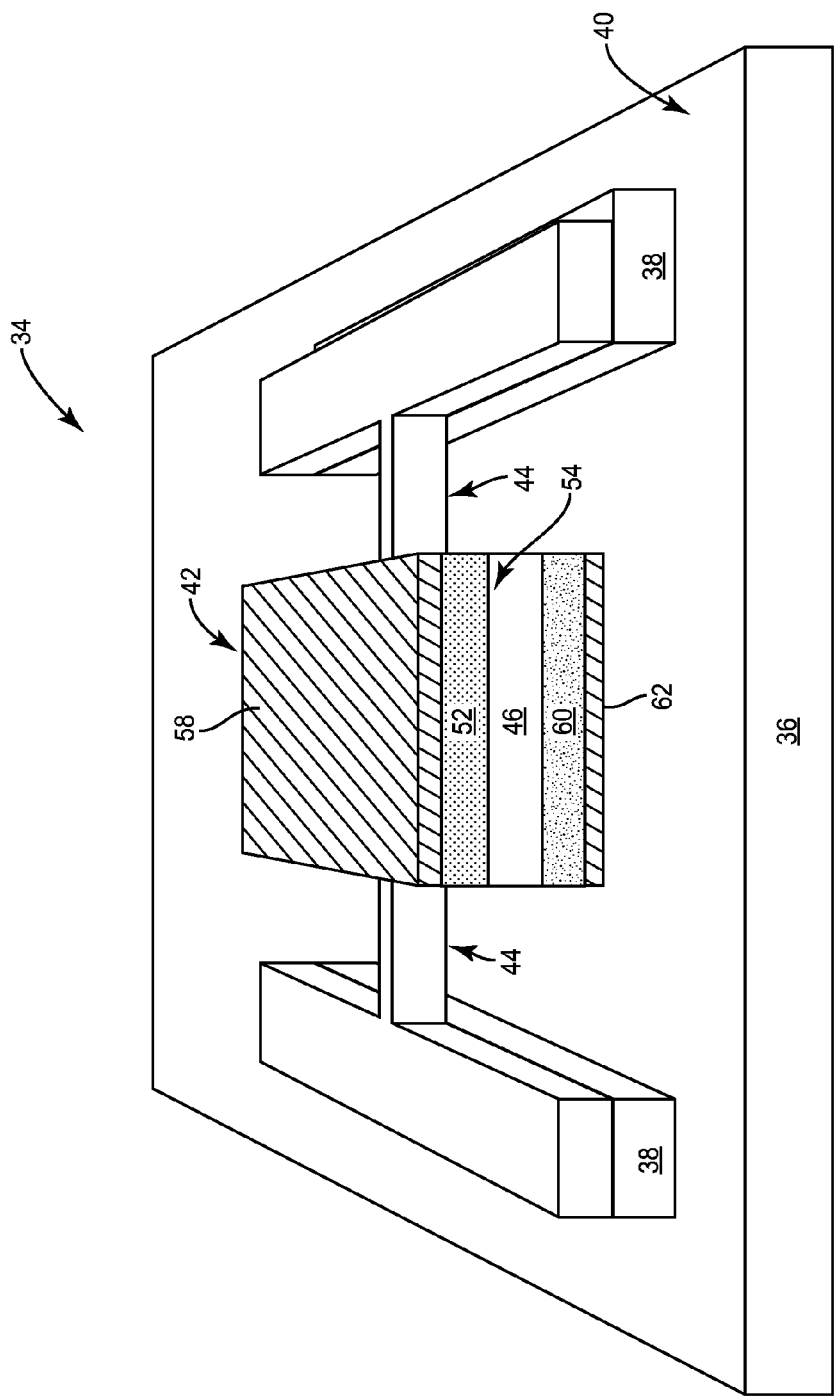
FIG. 13 is a three-dimensional representation of a MEMS vibrating device according to an additional embodiment of the present disclosure.

FIG. 13 shows the MEMS vibrating device 34 according to an additional embodiment of the present disclosure. The MEMS vibrating device 34 shown in FIG. 13 is substantially similar to that shown in FIG. 11, but does not include the first conductive layer 48 or the second conductive layer 50. Accordingly, the functional layer 52 is directly in contact with a first surface of the piezoelectric thin-film layer 46 opposite the substrate 36, while the additional functional layer 60 is directly in contact with a second surface of the piezoelectric thin-film layer 46 opposite the first surface. The MEMS vibrating device 34 may behave in a substantially similar manner to that described above with respect to FIG. 11, except that the third conductive layer 58 and the fourth conductive layer 62 may form the main electrodes to the MEMS vibrating device 34. The MEMS vibrating device 34 shown in FIG. 13 may be useful in situations wherein the functionality of the first conductive layer 48 and the second conductive layer 50 is not required. While not shown, the fourth conductive layer 62, the additional functional layer 60, the functional layer 52, and the third conductive layer 58 may form part of the mechanical support members 44 and extend over the anchors 38 to provide support for the vibrating body 42. As discussed above, portions of any of the layers discussed above may be strategically etched away in order to provide connection points to the various conductive layers as necessary.

Figure 14:
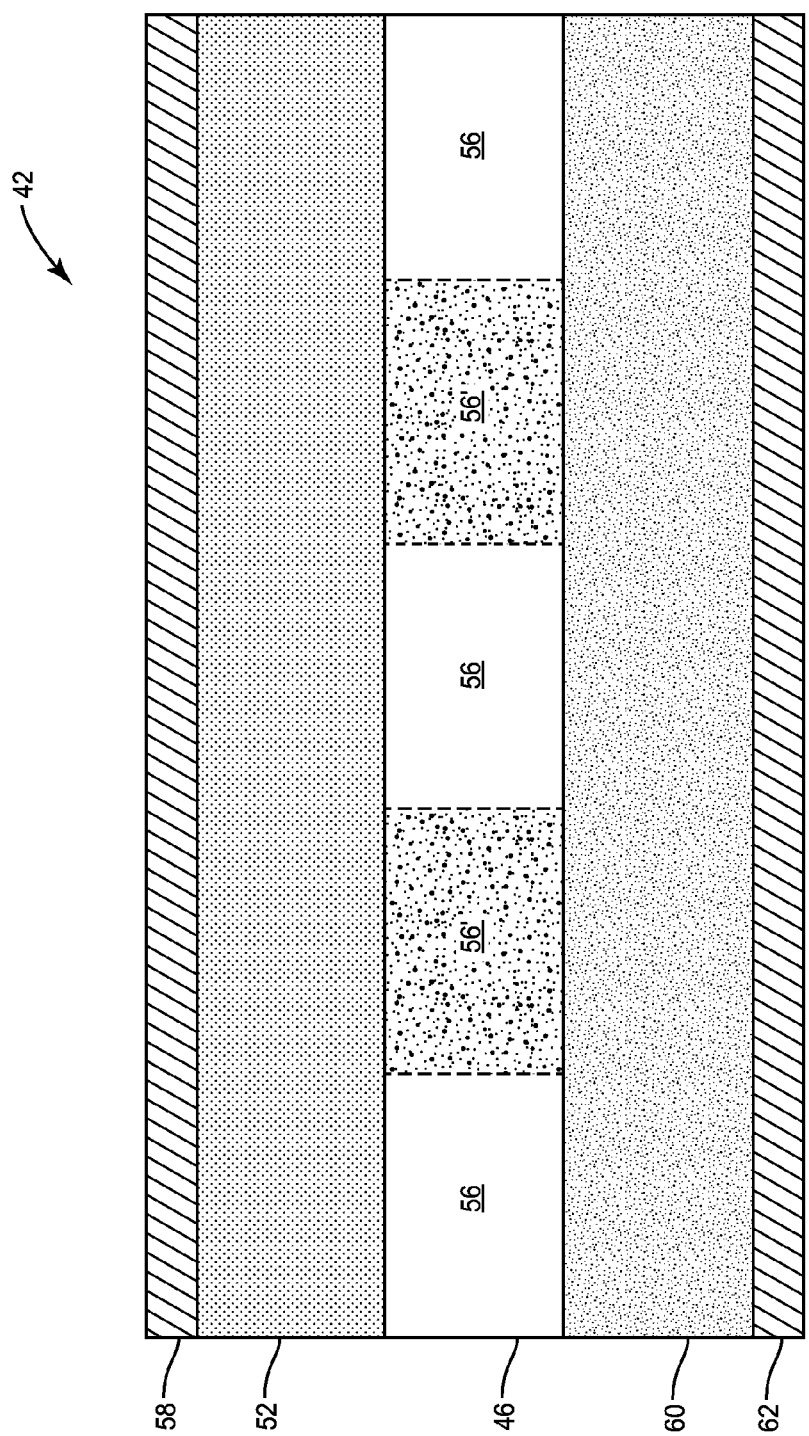
FIG. 14 is a cross-section showing details of a vibrating body in the MEMS vibrating device shown in FIG. 13 according to one embodiment of the present disclosure.

FIG. 14 shows a cross-section of the vibrating body 42, which is perpendicular to the front surface 54 of the vibrating body 42, according to one embodiment of the present disclosure. The details of the vibrating body 42 are substantially similar to those discussed above with respect to FIG. 12, however, the first conductive layer 48 and the second conductive layer 50 are omitted such that the functional layer 52 is directly in contact with a first surface of the piezoelectric thin-film layer 46 opposite the substrate 36 and the additional functional layer 60 is directly in contact with a second surface of the piezoelectric thin-film layer 46 opposite the first surface. In one embodiment wherein the functional layer 52 and the additional functional layer 60 comprise piezoelectric materials, the functional layer 52 may have a domain that is oriented in substantially the same way as a first set of domains 56 in the piezoelectric thin-film layer 46, while the additional functional layer 60 may have a domain that is oriented in substantially the same way as a second set of domains 56' in the piezoelectric thin-film layer 46, wherein the first set of domains 56 and the second set of domains 56' are inverted with respect to one another.

Those skilled in the art will recognize improvements and modifications to the embodiments of the present disclosure. All such improvements and modifications are considered within the scope of the concepts disclosed herein and the claims that follow.

What is claimed is:

1. A micro-electrical-mechanical system (MEMS) device comprising:
    a substrate;
    at least one anchor on a surface of the substrate; and
    a vibrating body suspended over the substrate by the at least one anchor and comprising:
        a periodically poled piezoelectric thin-film layer;
        a first conductive layer on a first surface of the vibrating body opposite the surface of the substrate;
        a second conductive layer on a second surface of the vibrating body opposite the first surface; and
        a functional layer over the first conductive layer.

2. The MEMS device of claim 1 wherein the periodically poled piezoelectric thin-film layer includes a number of nominal domains having a first width and a number of inverted domains having a second width.

3. The MEMS device of claim 2 wherein the functional layer is between about 0.001 times the first width plus the second width and 10 times the first width plus the second width.

4. The MEMS device of claim 2 wherein the functional layer comprises one of a dielectric material, a semiconductor material, an optically transparent material, an optically active material, a ferroelectric material, a pyroelectric material, a magnetostrictive material, and a ferromagnetic material.

5. The MEMS device of claim 3 wherein the functional layer comprises a piezoelectric material.

6. The MEMS device of claim 5 further comprising a third conductive layer over the functional layer.

7. The MEMS device of claim 6 wherein the functional layer is between about 0.001 times the first width plus the second width and 10 times the first width plus the second width.

8. The MEMS device of claim 2 further comprising an additional functional layer over the second conductive layer.

9. The MEMS device of claim 8 wherein the additional functional layer is between about 0.001 times the first width plus the second width and 10 times the first width plus the second width.

10. The MEMS device of claim 9 wherein the functional layer and the additional functional layer each comprise one of a dielectric material, a semiconductor material, an optically transparent material, an optically active material, a ferroelectric material, a pyroelectric material, a magnetostrictive material, and a ferromagnetic material.

11. The MEMS device of claim 8 wherein the functional layer and the additional functional layer are piezoelectric layers.

12. The MEMS device of claim 11 further comprising a third conductive layer over the functional layer and a fourth conductive layer over the additional functional layer.

13. The MEMS device of claim 12 further comprising tuning circuitry coupled between the third conductive layer and the fourth conductive layer and configured to provide a signal across the third conductive layer and the fourth conductive layer in order to change one or more resonant properties of the vibrating body.

14. The MEMS device of claim 12 wherein an electrical response to a signal provided between the first conductive layer and the second conductive layer is tuned based upon a signal applied between the third conductive layer, the fourth conductive layer, or both.

15. The MEMS device of claim 12 wherein the functional layer is between about 0.001 times the first width plus the second width and 10 times the first width plus the second width.

16. The MEMS device of claim 12 wherein the functional layer and the additional functional layer are domain inverted with respect to one another.

17. A micro-electrical-mechanical system (MEMS) device comprising:
    a substrate;
    at least one anchor on a surface of the substrate;
    a vibrating body suspended from the at least one anchor and comprising a periodically poled piezoelectric thin-film layer;
    a functional layer on a first surface of the vibrating body opposite the surface of the substrate;
    an additional functional layer on a second surface of the vibrating body opposite the first surface;
    a first conductive layer over the functional layer; and
    a second conductive layer over the additional functional layer.

18. The MEMS device of claim 17 wherein the periodically poled piezoelectric thin-film layer includes a number of nominal domains having a first width and a number of inverted domains having a second width.

19. The MEMS device of claim 18 wherein the functional layer and the additional functional layer have a thickness between about 0.001 times the first width plus the second width and 10 times the first width plus the second width.

20. The MEMS device of claim 19 wherein the functional layer and the additional functional layer each comprise one of a dielectric material, a semiconductor material, an optically transparent material, an optically active material, a ferroelectric material, a pyroelectric material, a magnetostrictive material, and a ferromagnetic material.

21. The MEMS device of claim 18 wherein the functional layer and the additional functional layer comprise a piezoelectric material.

22. The MEMS device of claim 21 wherein the functional layer and the additional functional layer have a thickness between about 0.001 times the first width plus the second width and 10 times the first width plus the second width.

23. The MEMS device of claim 21 wherein the functional layer and the additional functional layer are domain inverted with respect to one another.

24. The MEMS device of claim 21 wherein an electrical response to alternating current (AC) signals provided between the first conductive layer and the second conductive layer is tuned based upon a direct current (DC) voltage applied between the first conductive layer and the second conductive layer.

* * * * *